(12) United States Patent
Cho et al.

(10) Patent No.: US 7,704,682 B2
(45) Date of Patent: Apr. 27, 2010

(54) OPTICAL FIBER HAVING BRAGG GRATING AND METHOD OF MANUFACTURING THE SAME

(75) Inventors: Seung-Hyun Cho, Kyungki-do (KR); Byoungwhi Kim, Kyungki-do (KR); Hyeong-Ho Lee, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 929 days.

(21) Appl. No.: 10/903,055

(22) Filed: Jul. 30, 2004

(65) Prior Publication Data

US 2005/0095511 A1 May 5, 2005

(30) Foreign Application Priority Data

Nov. 4, 2003 (KR) ............... 10-2003-0077578

(51) Int. Cl.
*G02B 6/02* (2006.01)
(52) U.S. Cl. .............. 430/321; 430/290; 385/123
(58) Field of Classification Search ............. None
See application file for complete search history.

(56) References Cited

U.S. PATENT DOCUMENTS

| 5,732,170 | A | * | 3/1998 | Okude et al. | ............... 385/27 |
| 6,174,648 | B1 | * | 1/2001 | Terao et al. | ............... 430/321 |
| 6,221,566 | B1 | | 4/2001 | Kohnke et al. | |
| 2002/0048437 | A1 | * | 4/2002 | Nakamura et al. | ............... 385/96 |
| 2004/0052495 | A1 | * | 3/2004 | Englund et al. | ............... 385/141 |

FOREIGN PATENT DOCUMENTS

| KR | 010009257 | 2/2001 |
| KR | 1020020004405 A | 1/2002 |
| KR | 1020020007492 A | 1/2002 |
| KR | 1020030026264 | 2/2003 |

OTHER PUBLICATIONS

Computer-generated translation of KR 2003-0026264 (Mar. 2003).*
English-language translation of KR 2003-0026264 (Mar. 2003).*
IEEE Photonics Technology Letters, vol. 15, No. 4, Apr. 2003, pp. 557-559.

* cited by examiner

*Primary Examiner*—John A. McPherson
(74) *Attorney, Agent, or Firm*—Blakely, Sokoloff, Taylor & Zafman

(57) ABSTRACT

The method of manufacturing the optical fiber having the Bragg grating includes the steps of applying heat from a heat source to a predetermined portion of the optical fiber and thus diffusing impurities existing in a core of the optical fiber into a cladding of the optical fiber, so as to adjust an effective refractive index for a guided mode in the fiber corresponding to a predetermined wavelength, exposing UV light from an optical source to a phase mask having a periodic surface relief structure, and fabricating the Bragg grating having a predetermined period in the optical fiber using diffraction and interference of the UV light due to the periodic surface relief structure of the phase mask.

12 Claims, 4 Drawing Sheets

OPTICAL FIBER HAVING BRAGG GRATING AND METHOD OF MANUFACTURING THE SAME

BACKGROUND OF THE INVENTION

1. Field of the Invention

The present invention relates generally to an optical fiber and, more particularly, to an optical fiber having a Bragg grating, which allows light in a specific wavelength band to be selected out of light propagating through the core of the optical fiber by reflecting light having a wavelength that satisfies a Bragg condition and transmitting light having a wavelength that does not satisfy the Bragg condition.

2. Description of the Related Art

Generally, a fiber Bragg grating is manufactured utilizing an optical refractive index modulation effect that is generated when Ultra Violet (UV) rays are irradiated onto a core of the silica optical fiber in which impurities, such as germanium, boron, and phosphorous are doped in the core of the optical fiber.

When light is allowed to be incident on the optical fiber having a fiber Bragg grating, light with a wavelength that satisfies a Bragg condition is reflected, and light with a wavelength that does not satisfy the Bragg condition is transmitted. The wavelength that satisfies the Bragg condition is referred as a Bragg wavelength or a resonant wavelength. The fiber Bragg grating using such characteristics is generally used as a filter to select light in a specific wavelength band, and has been attracting a lot of interest from several years ago until now, as an optical device having various application fields.

FIG. 1 is a diagram showing a conventional method of manufacturing the fiber Bragg grating.

Referring to FIG. 1, in the conventional fiber Bragg grating manufacturing method, a periodic interference pattern 142 is directly formed in the core 131 the optical fiber using a phase mask 120 and UV light 110. This method employs a diffractive optical element (the phase mask 120) to spatially modulate the UV light beam. The phase mask 120 may be formed either holographically or by electron-beam lithography. When viewed from the side, the periodic surface relief structure 121 has square wave shapes. To manufacture the fiber Bragg grating, the optical fiber 130 is located near the one surface of the phase mask 120 having the periodic surface relief structure 121 to such an extent that the optical fiber 130 almost comes in contact with the one surface of the phase mask 120. The UV light 110 perpendicularly irradiated onto the phase mask 120 is diffracted due to the periodic surface relief structure 121 of the phase mask 120.

The phase mask 120 is made from flat slab of silica glass which is transparent to UV (ultra-violet) light. On one of the flat surfaces, a one dimensional periodic surface relief structure 121 is etched using photolithographic techniques. The shape of the periodic pattern approximates a square wave in profile. The optical fiber 130 is paced almost in contact with the corrugations of the phase mask 120 as shown in FIG. 1. Ultraviolet light 110 which is incident normal to the phase mask 120 passes through and is diffracted by the periodic corrugations 121 of the phase mask 120.

Normally, most of the diffracted light 111, 112, and 113 is contained in the +1, 0, −1 diffracted orders. However, the phase mask 120 is designed to suppress the diffraction into the zero-order 112 by properly controlling the depth of the corrugations in the phase mask. In practice, the amount of light 112 in the zero-order can be reduced to less than 5% with approximately 40% of the total light intensity divided equally in the ±1 orders 111 and 113. The two ±1 diffracted order beams 111 and 113 interfere to produce a periodic pattern that photoimprints a corresponding grating in the optical fiber 130. If the period of the phase mask grating 120 is $\Lambda_{mask}$, the period of the photoimprinted index grating 141 is $\Lambda_{mask}/2$.

However, when the fiber Bragg grating is manufactured using the conventional method, the period of the phase mask grating 120 is constant, so that the resonant wavelength of the fiber Bragg grating is fixed. For example, if the predetermined resonant wavelength of a grating is $\lambda_1$, the conventional method is problematic in that a new phase mask 120 having a new period must be used, or the optical fiber 130 used to manufacture the fiber Bragg grating operated at the wavelength $\lambda_1$ must be replaced with a new optical fiber having another refractive index so as to manufacture a fiber Bragg grating operated at the new wavelength other than the wavelength $\lambda 1$.

Accordingly, the conventional method is disadvantageous in that, since the optical fiber 130 or the phase mask 120 must be replaced with a new optical fiber or a new phase mask, so that additional costs are required only to adjust the resonant wavelength.

SUMMARY OF THE INVENTION

Accordingly, the present invention has been made keeping in mind the above problems occurring in the prior art, and an object of the present invention is to provide a method of easily and simply controlling the resonant wavelength of a fiber Bragg grating to adjust the resonant wavelength of the fiber Bragg grating, which does not require a phase mask having a new period or an optical fiber having a new refractive index.

In order to accomplish the above object, the present invention provides the method of manufacturing the optical fiber having the Bragg grating, including the steps of applying heat from a heat source to a predetermined portion of the optical fiber and thus diffusing impurities existing in a core of the optical fiber into a cladding of the optical fiber, so as to adjust an effective refractive index for a guided mode in the fiber corresponding to a predetermined wavelength, exposing UV light from an optical source to a phase mask having a periodic surface relief structure, and fabricating the Bragg grating having a predetermined period in the optical fiber using diffraction and interference of the UV light due to the periodic surface relief structure of the phase mask.

The diameter of the core of the optical fiber may be changed according to an extent of the thermal diffusion.

The period of the phase mask may be fixed.

The UV light source may be an excimer laser having high energy.

The heat source may be an oxy-hydrogen torch flame, a $CO_2$ gas laser, or an electrically inductive and resistive metal.

The extent of the thermal diffusion may be controlled by controlling the temperature of the heat source.

The extent of the thermal diffusion may be controlled by controlling the time to heat the optical fiber.

The extent of the thermal diffusion may be controlled by controlling the distance between the heat source and the optical fiber.

A jacket surrounding the cladding of the optical fiber may be removed over a length corresponding to a length of the heat source and the phase mask.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
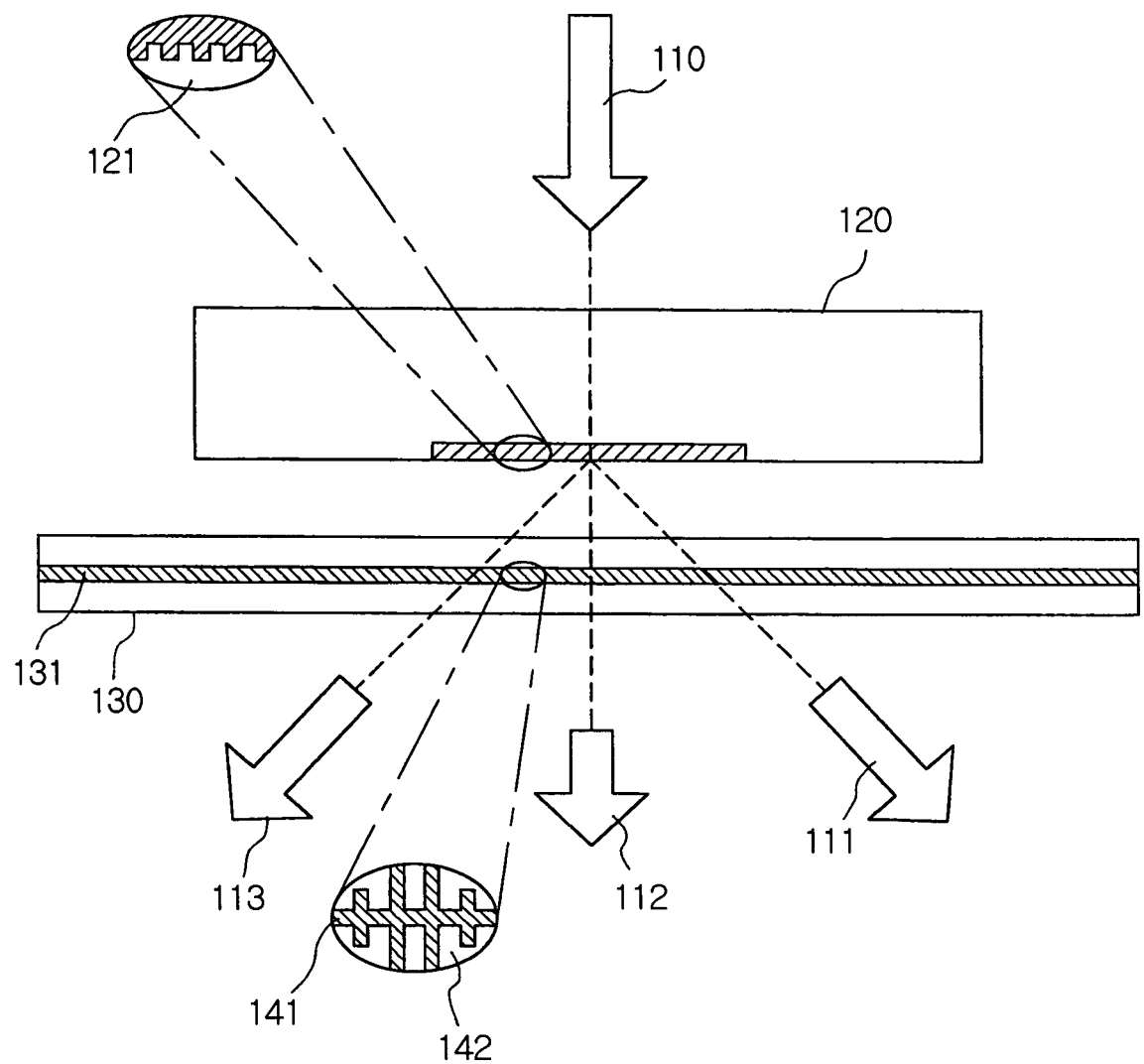
FIG. 1 shows a conventional method of manufacturing a fiber Bragg grating.

Reference now should be made to the drawings, in which the same reference numerals are used throughout the different drawings to designate the same or similar components.

A principle for manufacturing a fiber Bragg grating according to the present invention is described below.

The resonant wavelength, or Bragg wavelength of the fiber Bragg grating represented by $\lambda_B$ can be expressed as Equation 1 below.

$$\lambda_B = 2n_{eff}\Lambda \quad (1)$$

where $\lambda_B$, $n_{eff}$, and $\Lambda$ represent the resonant wavelength of the fiber Bragg grating, the effective index and the period of the fiber Bragg grating, respectively. As shown in Equation 1, the resonant wavelength of the fiber Bragg grating is proportional to the effective index and the period of the fiber Bragg grating. Accordingly, if the effective index of the optical fiber is changed while the period of the fiber Bragg grating is kept constant, the resonant wavelength of the fiber Bragg grating can be changed. That is, to form a fiber Bragg grating having a desirable resonant wavelength in the optical fiber, the resonant wavelength of the fiber Bragg grating can be changed by adjusting the effective index of a portion of the optical fiber where the fiber Bragg grating is fabricated without replacing the phase mask or the entire optical fiber.

Figure 2:
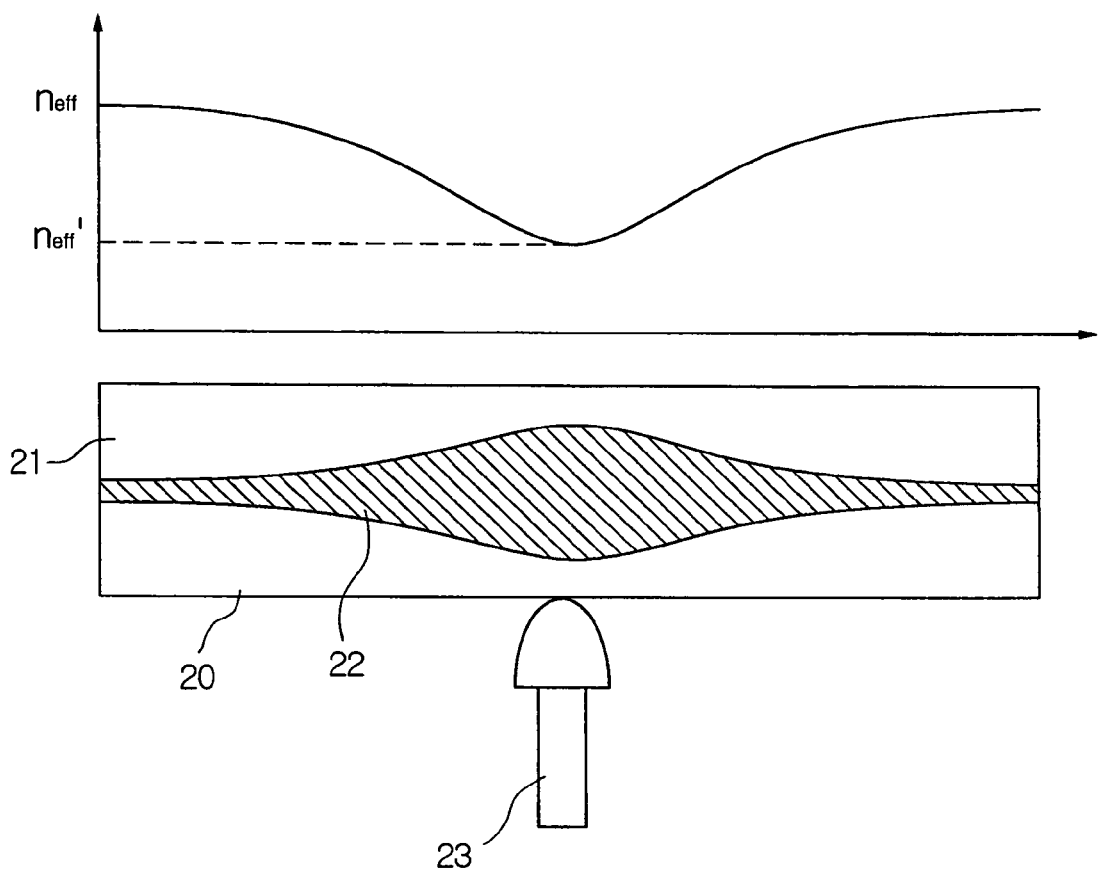
FIG. 2 shows a method of controlling the refractive index using thermal diffusion of the fiber core according to an embodiment of the present invention.

FIG. 2 shows a method of controlling a effective index using the thermal diffusion of an optical fiber according to an embodiment of the present invention.

In the embodiment of the present invention, an optical fiber 20 having characteristics shown in Table 1 is used to help make a clear understanding.

TABLE 1

| | |
|---|---|
| Numerical aperture | 0.20 |
| Cutoff wavelength | 1250 ± 50 nm |
| Mode field diameter (at 1550 nm) | 8.4 ± 0.5 um |
| Difference between diameters of core and cladding | <0.7 um |
| Cladding diameter | 124.7 ± 1.0 um |
| Coating diameter | 250 ± 2.0 um |

When the optical fiber 20 having the characteristics shown in Table 1 is prepared, a polymer based coating (jacket) (not shown) surrounding the outside of a cladding 21 is removed to perform a thermal diffusion process. In this case, the sufficient length of region where the coating is removed must be sufficiently ensured in view of manufacturing a fiber Bragg grating as well as the thermal diffusion process. Accordingly, the entire length of the region where the coating is removed must be greater than the length of a heat source 23.

In the embodiment, the heat source 23 used to perform the thermal diffusion process is an oxyhydrogen torch flame that is used to manufacture a fused-taper optical fiber coupler, and the diameter of the oxyhydrogen torch flame is about 10 mm. Accordingly, the length of the region where the coating is removed must be greater than 10 mm. Alternatively, $CO_2$ gas laser or an electrically inductive and resistive metal can be used as the heat source 23.

Furthermore, to fabricate the fiber Bragg grating in optical fiber after the thermal diffusion process, an eximer laser to provide UV light with high output power and phase mask with uniform period are used. In this case, when the optical fiber is placed to be adjacent to the phase mask and the eximer laser irradiates onto the phase mask while the coating of the optical fiber is not removed, it is difficult to fabricate the fiber Bragg gratings. Accordingly, it is preferable to remove the coating from the optical fiber over a length corresponding to the length of the phase mask in view of the manufacturing process for the fiber Bragg gratings.

For example, in the case of the phase mask used in the embodiment of the present invention, the length of the phase mask occupied by the grating is about 10 mm, and the total length of the phase mask is about 30 mm. That is, the coating must be removed from the optical fiber over a length of about 30 mm to perform the thermal diffusion and write the fiber Bragg gratings. However, it is more preferable that the coating is removed over a length of about 45 mm, which is obtained by adding the margin of 15 mm to the length of the phase mask, to stably perform the processes.

The optical fiber 20, whose coating is removed, is immediately placed in a fused-taper type optical fiber coupler manufacturing system (not shown) to perform the thermal diffusion process. Thereafter, heat is applied to the portion of the optical fiber, where the coating is removed, using the oxyhydrogen torch flame 23 that is principally used to perform a fusion process when an optical fiber coupler is manufactured. In this case, it is very important to control the extent of thermal diffusion. In the embodiment of the present invention, the thermal diffusion of the optical fiber core is enabled using these methods of: 1) controlling the temperature of the heat; 2) controlling the time to heat the optical fiber core using the heat source; and 3) controlling the distance between the optical fiber and the heat source.

Table 2 shows the diameter changes of the core 22 of the optical fiber according to heating time during the thermal diffusion process.

TABLE 2

The diameter changes of the core according to the heating time during the thermal diffusion process.

| Heating time | Core diameter (um) | Cladding diameter (um) |
|---|---|---|
| 0 min. | 8.42 | 126.31 |
| 1 min. | 8.42 | 125.26 |
| 2 min. | 9.47 | 125.26 |
| 3 min. | 12.63 | 126.31 |
| 4 min. | 12.66 | 126.31 |
| 5 min. | 14.74 | 125.26 |

The Table 2 shows the results obtained by observing the extents of thermal diffusion of the core 22 while varying the time to heat the optical fiber 20 from one minute to five minutes using the heat source 23. Extended core 22 diameters are measured at the center of the optical fiber 20 core diffused region by using the far field technique.

When heat is applied to the optical fiber 20 from the heat source 23 during the thermal diffusion process, the diameter of the core 22 increases in proportion to the heating time due to the diffusion of impurities existing in the core 22 of the optical fiber.

Table 3 shows the diameters of the diffused core 22 according to changes in the height of the oxyhydrogen torch flame 23 (inversely proportional to the distance between an optical fiber and a torch flame) when the heating time is fixed for three minutes.

TABLE 3

Diameters of core and cladding according to the heights of torch flames (inversely proportional to the distances between optical fiber and torch flames)

| Height of torch flame (um) | Core diameter (um) | Cladding diameter (um) |
|---|---|---|
| Before heating | 8.42 | 125.26 |
| 13000 | 10.52 | 126.31 |
| 13500 | 10.53 | 125.26 |
| 14000 | 12.63 | 126.31 |
| 14500 | 12.63 | 125.26 |
| 15000 | 12.63 | 126.31 |
| 15500 | 12.63 | 126.31 |

As shown in Table 3, the diameter of the diffused core 22 increases as the height of the torch flame 23 increases from 13000 um to 14000 um. However, when the height of the torch flame 23 is 14000 um or above, the diameter of the diffused core 22 does not increase and remains at a constant value even though the height of the torch flame 23 increases. It can be known from the above results that the temperature of the torch flame 23 increases as the height of the torch flame 23 increases, but the increase of the temperature has a certain limitation.

As shown in FIG. 2, Tables 2 and 3, in the method of the present invention, impurities, such as germanium, boron and phosphorous existing in the optical fiber core 22 are diffused into the optical fiber cladding 21 through the thermal diffusion process. With the thermal diffusion process, the optical fiber 20, in which the diameter and effective refractive index of the core 22 are changed, can be manufactured.

In the embodiment of the present invention, after the thermal diffusion process is performed, the grating fabricating process is performed to fabricate a fiber Bragg grating in the optical fiber 20 in which the diameter and effective refractive index of the core 22 are changed.

Figure 3:
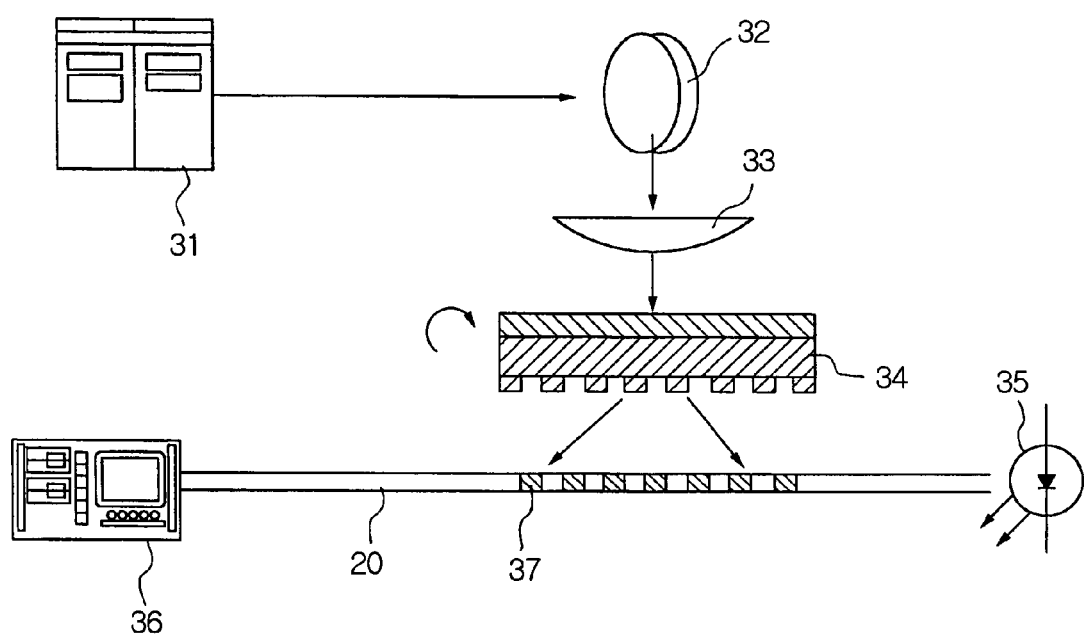
FIG. 3 shows an apparatus for manufacturing a fiber Bragg grating.

FIG. 3 shows an apparatus for manufacturing the fiber Bragg grating.

The fiber Bragg grating manufacturing apparatus includes an eximer laser 31, a UV mirror 32, a cylindrical lens 33, a phase mask 34, a broadband optical source 35, and an optical spectrum analyzer 36.

The eximer laser 31 is a UV light emitting optical source having an oscillation wavelength of 248 nm. The UV mirror 32 is used to facilitate the manufacturing process, to rotate a beam output from the eximer laser 31 by 90 degrees, and to irradiate the rotated beam onto the cylindrical lens 33. The cylindrical lens 33 is a device used to control the energy density of the beam. When the beam having a desirable energy density is produced by adjusting the focus of the cylindrical lens 33, the beam is irradiated onto the phase mask 34. One surface of the phase mask 34 is etched to have a periodic surface relief structure. The optical fiber 20 is placed at a location adjacent to that the one surface of the phase mask 34 having the periodic surface relief structure to such an extent that the optical fiber 20 almost comes in contact with the one surface of the phase mask 34. The UV light perpendicularly irradiated onto the phase mask 34 is transmitted through the phase mask 34 and diffracted by the periodic surface relief structure of the phase mask 34. Two beams of light diffracted in +1 and −1 orders generate an interference phenomenon and form a periodic pattern. In this case, the two beams generating the interference phenomenon and fabricating the periodic pattern optically form a grating structure in the core of the optical fiber 20 in which the diameter and effective refractive index of the core are changed according to the embodiment of the present invention. In this way, the fiber Bragg grating is formed in the optical fiber 20.

Additionally, in the fiber Bragg grating manufacturing apparatus, the broadband optical source 35 is connected to one end of the optical fiber 20 and the optical spectrum analyzer 36 is connected to the other end of the optical fiber 20, so that the operational characteristics of the fiber Bragg grating can be observed in real time.

Figure 4:
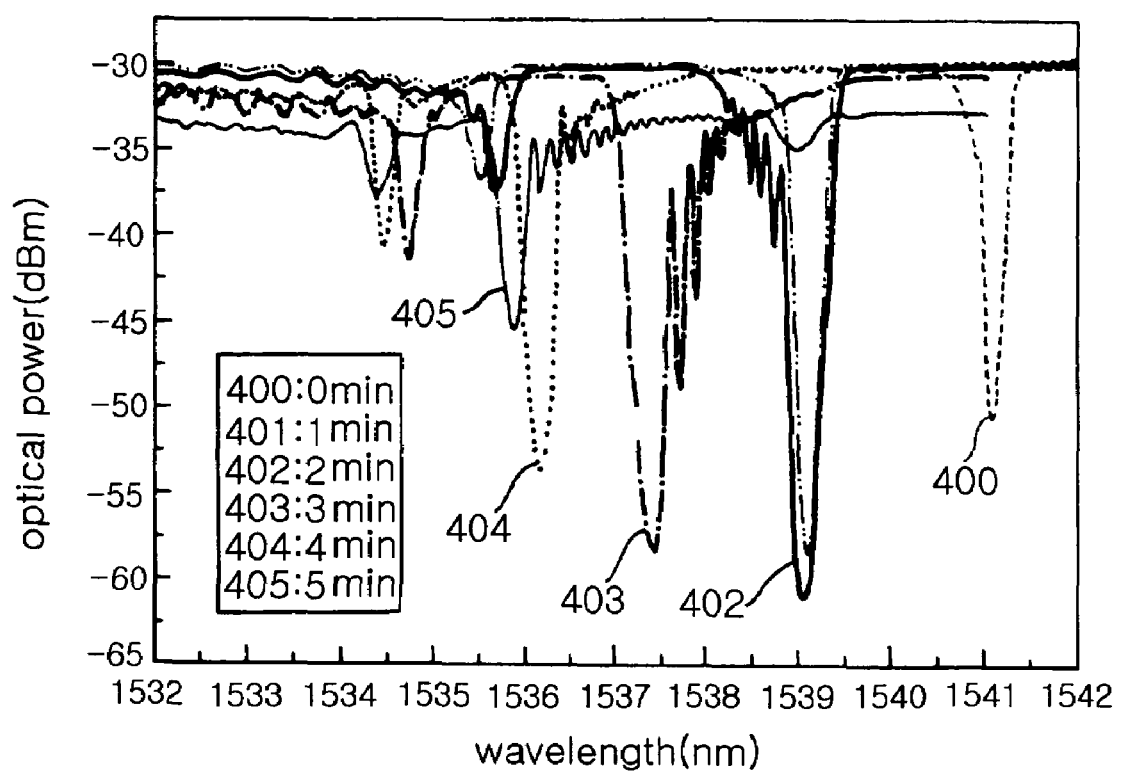
FIG. 4 shows the transmission spectrum of the optical fiber having a Bragg grating according to the embodiment of the present invention.

FIG. 4 shows the transmission spectra of the fiber Bragg grating according to the embodiment of the present invention.

Referring to FIG. 4, when the grating is formed in the optical fiber 20 using a single-phase mask 34, whose period is fixed at 1060 nm, by the conventional method, it can be known from the results of experiments that the resonant wavelength 400 of the grating is 1541.08 nm.

In contrast, as shown in FIG. 4, even in the case of using the single-phase mask whose period is fixed at 1060 nm, it can be known that the resonant wavelength of the grating 37 fabricated in the optical fiber 20 having undergone the thermal diffusion process transitions from a resonant wavelength 401 to a resonant wavelength 405 as thermal diffusion time increases. A detailed description is made with reference to FIG. 4 below. The resonant wavelength 401 of the grating 37 fabricated in the optical fiber 20 having undergone the thermal diffusion process for one minute is 1539.1 nm, the resonant wavelength 402 of the grating 37 fabricated in the optical fiber 20 having undergone the thermal diffusion process for two minutes is 1539.0 nm, the resonant wavelength 403 of the grating 37 fabricated in the optical fiber 20, in which the thermal diffusion process is performed for three minutes is 1537.4 nm, the resonant wavelength 404 of the grating 37 fabricated in the optical fiber 20 having undergone the thermal diffusion process for four minutes is 1536.1 nm, and the resonant wavelength 405 of the grating 37 fabricated in the optical fiber 20 having undergone the thermal diffusion process for five minutes is 1535.8 nm. While the grating 37 fabricated in the optical fiber 20 has undergone the thermal diffusion process for five minutes, the resonant wavelength of the grating 37 transitions to a maximum of 6.72 nm.

The present invention is advantageous in that a resonant wavelength is easily controlled when the fiber Bragg grating is manufactured.

The present invention is advantageous in that a phase mask having a new period or an optical fiber having a new refractive index is not required to adjust the resonant wavelength of a fiber Bragg grating, and thus the resonant wavelength of the fiber Bragg grating is easily and simply controlled.

Furthermore, the present invention is advantageous in that an optical fiber provided with a Bragg grating having desirable resonant wavelength characteristics can be easily manufactured.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing an optical fiber having a Bragg grating, comprising:

applying heat from a heat source to a portion of the optical fiber and thus diffusing impurities existing in a core of the optical fiber into a cladding of the optical fiber, so as to adjust an effective refractive index for a guided mode in the optical fiber corresponding to a predetermined wavelength, wherein the impurities include germanium, boron and phosphorous and the germanium is doped into the core of the optical fiber at high density, exposing UV light from an optical source to a phase mask having a periodic surface relief structure wherein the optical source is an excimer laser having a high output power; and, fabricating the Bragg grating having a predetermined period in the optical fiber using diffraction and interference of the UV light due to the periodic surface relief structure of the phase mask, wherein said applying the heat comprises applying the heat under conditions predetermined to transition a resonant wavelength of the Bragg grating to a desired resonant wavelength, and manufacturing a second optical fiber having a second Bragg grating having a different resonant wavelength than the Bragg grating, when the second optical fiber has the same refractive index as the optical fiber, and when the same phase mask is used, by applying heat to the second optical fiber differently than the heat applied to the optical fiber to diffuse impurities differently in the second optical fiber.

2. The method as set forth in claim 1, wherein the optical fiber is a photosensitive fiber.

3. The method as set forth in claim 1, wherein a diameter of the core of the optical fiber is changed according to an extent of the thermal diffusion.

4. The method as set forth in claim 1, wherein the phase mask is a single-phase mask whose period is fixed.

5. The method as set forth in claim 1, wherein the excimer laser comprises an oscillation wavelength of 248 nm.

6. The method as set forth in claim 1, wherein an extent of the thermal diffusion is controlled by controlling a temperature of the heat source.

7. The method as set forth in claim 1, wherein an extent of the thermal diffusion is controlled by controlling time to heat the optical fiber.

8. The method as set forth in claim 1, wherein an extent of the thermal diffusion is controlled by controlling a distance between the heat source and the optical fiber.

9. The method as set forth in claim 1, wherein a jacket surrounding the cladding of the optical fiber is removed over a length corresponding to a length of the heat source or the phase mask.

10. An optical fiber having a Bragg grating manufactured using the method of claim 1.

11. The method as set forth in claim 1, wherein the heat source comprises one of an oxyhydrogen torch flame and an electrically inductive and resistive metal.

12. The method of claim 1 wherein the conditions predetermined to transition a resonant wavelength of the Bragg grating to a desired resonant wavelength are conditions suitable for transitioning the resonant wavelength of the Bragg grating from 1539.1 nm to the desired wavelength of 1535.8 nm in five minutes.

* * * * *